(12) United States Patent
Kanagawa (10) Patent No.: US 9,070,426 B2
(45) Date of Patent: Jun. 30, 2015

(54) SEMICONDUCTOR MEMORY DEVICE CAPABLE OF SETTING AN INTERNAL STATE OF A NAND FLASH MEMORY IN RESPONSE TO A SET FEATURE COMMAND

(71) Applicant: KABUSHIKI KAISHA TOSHIBA, Minato-ku (JP)

(72) Inventor: Naoaki Kanagawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/204,565

(22) Filed: Mar. 11, 2014

(65) Prior Publication Data

US 2015/0071001 A1     Mar. 12, 2015

Related U.S. Application Data

(60) Provisional application No. 61/875,151, filed on Sep. 9, 2013.

(51) Int. Cl.
*G11C 16/20* (2006.01)
*G11C 7/10* (2006.01)
*G11C 16/06* (2006.01)

(52) U.S. Cl.
CPC . *G11C 7/10* (2013.01); *G11C 16/06* (2013.01)

(58) Field of Classification Search
CPC .......................................................... G11C 7/20
USPC ........................................ 365/185.17, 185.33
See application file for complete search history.

(56) References Cited

U.S. PATENT DOCUMENTS

| 6,633,956 | B1 | 10/2003 | Mitani |
| 7,017,825 | B2 * | 3/2006 | Ohya et al. ..................... 235/492 |
| 7,760,554 | B2 * | 7/2010 | Eitan et al. ............... 365/185.28 |
| 2004/0054864 | A1 | 3/2004 | Jameson |
| 2010/0106919 | A1 | 4/2010 | Manning |

FOREIGN PATENT DOCUMENTS

| JP | 2001-297316 A | 10/2001 |
| JP | 2004-110785 A | 4/2004 |
| JP | 2012-507100 A | 3/2012 |
| JP | 4991971 B1 | 8/2012 |

* cited by examiner

*Primary Examiner* — Andrew Q Tran
(74) *Attorney, Agent, or Firm* — Oblon, McClelland, Maier & Neustadt, L.L.P.

(57) ABSTRACT

A semiconductor memory device according to an embodiment is provided with a plurality of first latch circuits that latch setting-data at different timings, a plurality of hold circuits provided corresponding to the respective plurality of first latch circuits, each holding data latched by the corresponding first latch circuit, and an address decoder that decodes an address that specifies a destination to hold data. Each of the plurality of hold circuits has one or more holding parts that hold data latched by the corresponding first latch circuit based on a decode signal decoded by the address decoder.

7 Claims, 12 Drawing Sheets

SEMICONDUCTOR MEMORY DEVICE CAPABLE OF SETTING AN INTERNAL STATE OF A NAND FLASH MEMORY IN RESPONSE TO A SET FEATURE COMMAND

CROSS REFERENCE TO RELATED APPLICATIONS

This application is based upon and claims the benefit of U.S. provisional Application No. 61/875,151, filed on Sep. 9, 2013, the entire contents of which are incorporated herein by reference.

FIELD

Embodiments of the present invention relate to a semiconductor memory device.

BACKGROUND

For NAND flash memories, there are specifications for externally changing the settings of memory internal states, such as an output buffer size and operation mode selection. A process for issuing a command for changing the settings of memory internal states in accordance with the specifications and executing the command is called as a set feature command sequence.

There is a tendency for NAND flash memories that, as the memory capacity increases, the number of setting-change allowable states increases. Information on a state for which a setting change has been instructed by a set feature command is stored in a register in a memory. Therefore, as the number of setting-change allowable states increases, the number of registers has to be increased, which results in increase of the memory chip area.

DETAILED DESCRIPTION

A semiconductor memory device according to an embodiment is provided with a plurality of first latch circuits latching setting-data at different timings, a plurality of hold circuits provided corresponding to the respective plurality of first latch circuits, each holding data latched by the corresponding first latch circuit, and an address decoder decoding an address that specifies a destination to hold data. Each of the plurality of hold circuits has one or more holding parts that hold data latched by the corresponding first latch circuit based on a decode signal decoded by the address decoder.

Hereinafter, with reference to the drawings, an embodiment of the present invention will be explained.

(First Embodiment)

Figure 1:
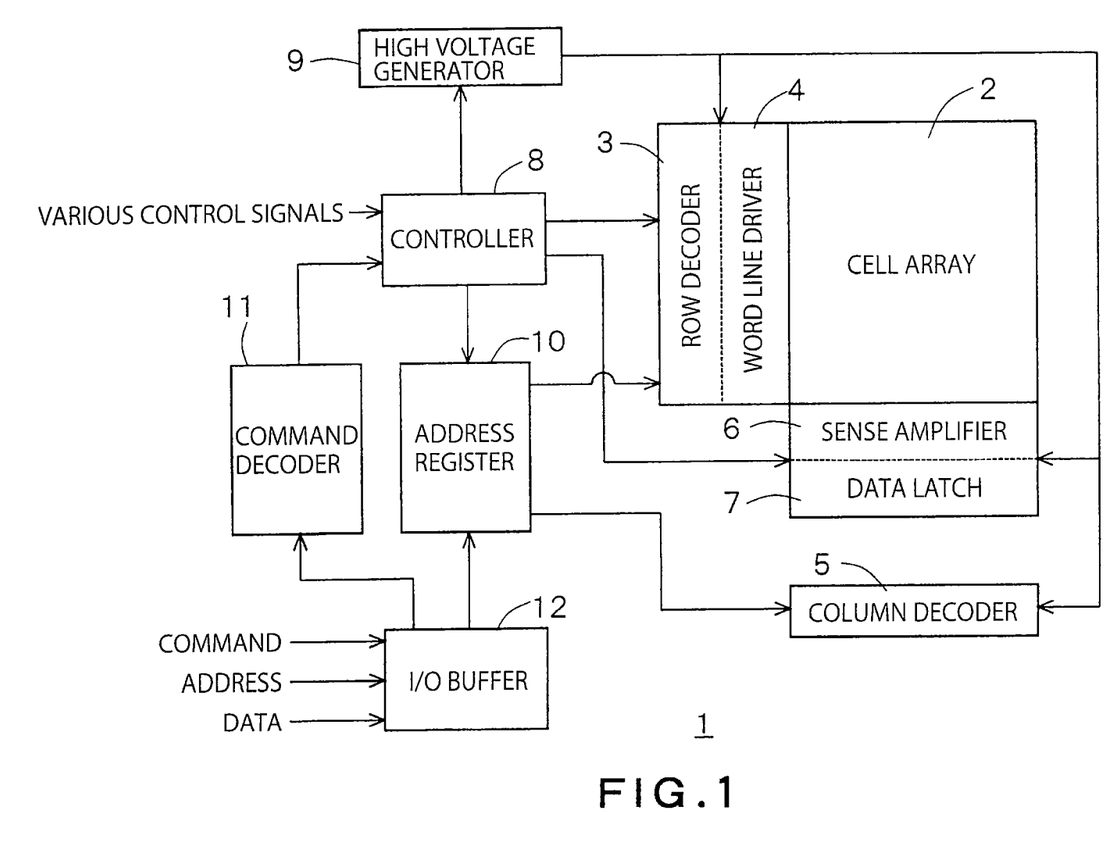
FIG. 1 is a block diagram of a semiconductor memory device according to a first embodiment.

FIG. 1 is a block diagram of a semiconductor memory device according to a first embodiment. FIG. 1 shows an NAND flash memory as an example of the semiconductor memory device.

The semiconductor memory device of FIG. 1 is provided with a cell array 2, a row decoder 3, a word line driver 4, a column decoder 5, a sense amplifier (S/A) 6, a data latch circuit 7, a controller 8, a high voltage generator 9, an address register 10, a command decoder 11, and an I/O buffer 12.

The cell array 2 has a plurality of NAND strings each having series-connected memory cells. The cell array 2 is divided into a plurality of blocks. In each block, a plurality of above-mentioned NAND strings are arranged in a column direction. Each NAND string has a plurality of series-connected memory cells, a selection gate transistor connected to these cells at one end thereof, and another selection gate transistor connected to these cells at the other end thereof.

A gate of each memory cell in a NAND string is connected to the corresponding word line. Each NAND string is connected to the corresponding bit line via the corresponding selection gate transistor.

Each word line connected to a gate of each memory cell in a NAND string is connected to the row decoder 3. The row decoder 3 decodes a row address transferred from the address register 10. Near the row decoder 3, the word line driver 4 is provided. Based on decoded data, the word line driver 4 generates a voltage for driving each word line.

A bit line connected to each NAND string is connected to the sense amplifier 6 via a bit-line selection transistor. Read data detected by the sense amplifier 6 is held in the data latch circuit 7 as, for example, binary data.

The column decoder 5 shown in FIG. 1 decodes a column address from the address register 10. Moreover, the column decoder 5 determines, based on a result of the decoding, whether to transfer data held in the data latch circuit 7 to a data bus.

The I/O buffer 12 buffers an address, data, and a command input from I/O terminals. Moreover, the I/O buffer 12 transfers an address, a command, and data to the address register 10, a command register, and a data bus, respectively.

The controller 8 distinguishes between an address and a command, and controls an operation of the sense amplifier 6 and the like.

The controller 8 performs control to store information for a setting change in memory state into a memory in accordance with the set feature command sequence described above.

Figure 2:
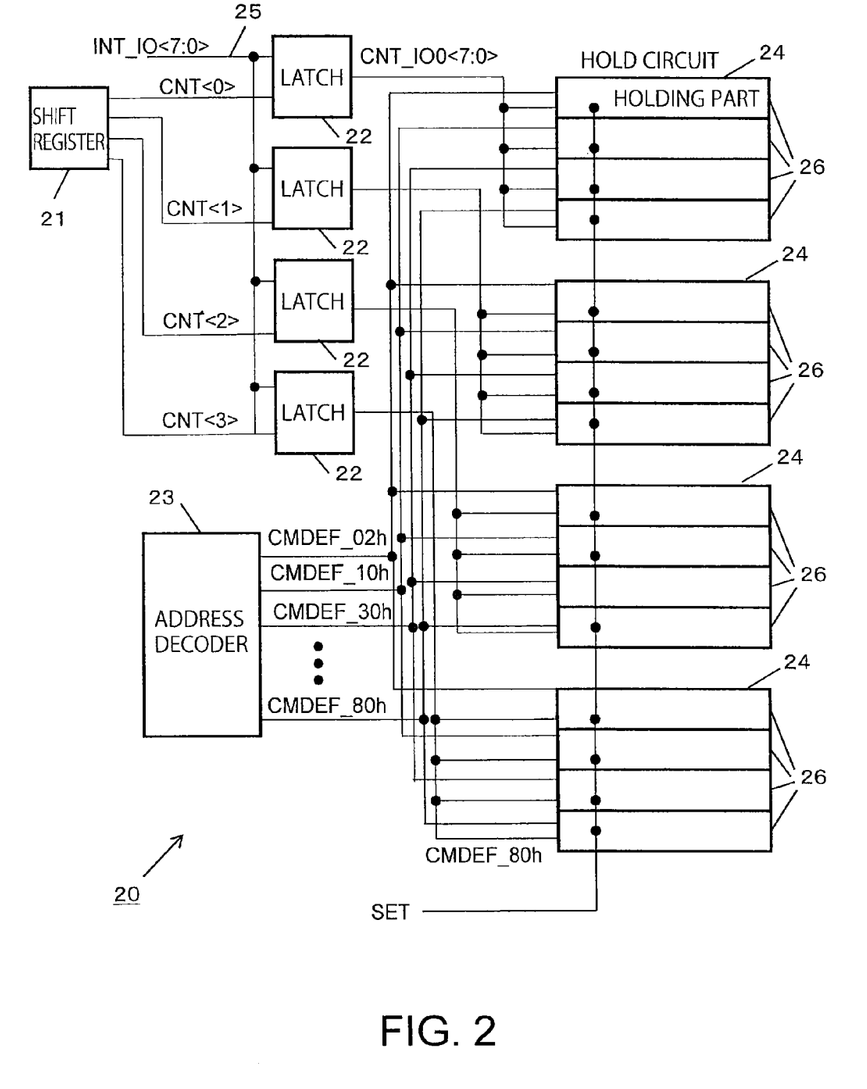
FIG. 2 is a block diagram of a set feature processing part 20 that executes a set feature command sequence.

FIG. 2 is a block diagram of a set feature processing part 20 that executes a set feature command sequence. The set feature processing part 20 of FIG. 2 is installed, for example, in the controller 8. Or at least part of the set feature processing part 20 of FIG. 2 may be provided separated from the controller 8.

The set feature processing part 20 of FIG. 2 has a shift register 21, a plurality of latch circuits (first latch circuits, or Data Latch) 22, an address decoder 23, and a plurality of hold circuits 24 (Data Storage Circuit).

The shift register 21 generates a plurality of pulse signals of different timings. The plurality of latch circuits 22 latch setting-data at different timings in synchronism with the corresponding pulse signals, respectively.

The address decoder 23 decodes an address for specifying a specific hold circuit 24 for holding setting-data.

The plurality of hold circuits 24 are provided corresponding to the plurality of latch circuits 22, respectively, and hold, at the same timing, a plurality of data latched by the corresponding latch circuits 22 at different timings.

A set feature command, setting-data, and an address for specifying a hold circuit 24 for holding setting-data may be externally supplied through a common I/O bus 25, or through separate buses or signal lines.

Each of the plurality of hold circuits 24 has one or more holding parts 26. In the example of FIG. 2, each hold circuit 24 has four holding parts 26. It is decided by a decode signal decoded by the address decoder 23 which of the four holding parts 26 holds setting-data. That is, with an address supplied through the I/O bus 25, one of the holding parts 26 is selected to hold setting-data.

Data latched by each latch circuit 22 is supplied to the hold circuit 24 corresponding to each latch circuit 22. Therefore, data latched by a certain latch circuit 22 is supplied to the hold circuit 24 corresponding to the latch circuit 22. The data supplied to the corresponding hold circuit 24 is held in a holding part 26 specified by an address supplied through the I/O bus 25, among a plurality of holding parts 26 in the hold circuit 24.

In FIG. 2, each of decode signals generated by the address decoder 23 is used for selecting the corresponding holding part 26 in each hold circuit 24.

Figure 3:
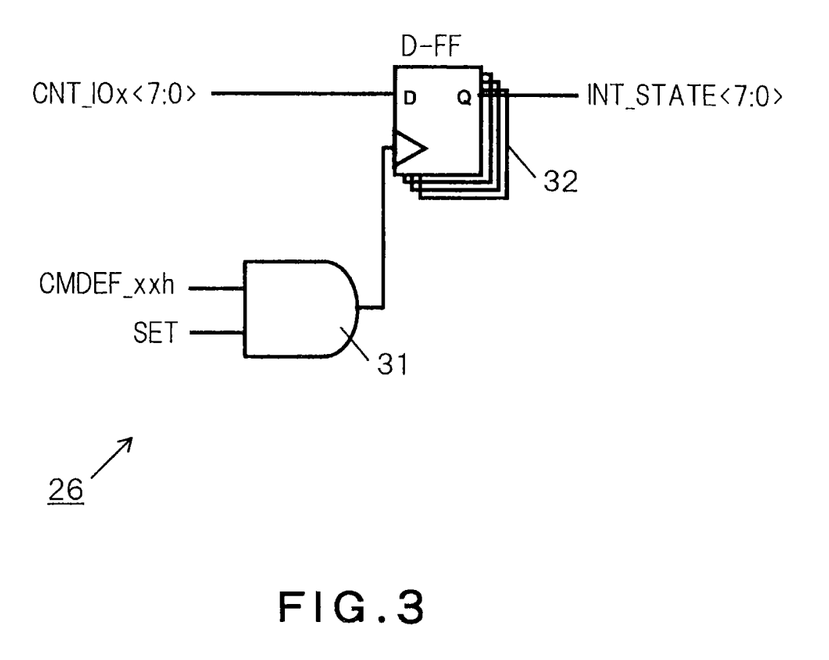
FIG. 3 is a block diagram of each holding part 26 in each hold circuit 24.

FIG. 3 is block diagram showing the internal configuration of each holding part 26 in each hold circuit 24. The holding part 26 of FIG. 3 has an AND gate (a first logical operation unit) 31 and D flip-flops (hereinafter, D-FF) 32.

The AND gate 31 generates a logical product signal of a decode signal CMDEF_xxh generated by the address decoder 23 and a SET signal. Accordingly, when a specific address is selected and the SET signal is high, the output of the AND gate 31 becomes high.

The D-FFs 32 hold output signals of the corresponding latch circuit 22 in synchronism with a logical product signal generated by the AND gate 31. That is, the D-FFs 32 hold output signals of the corresponding latch circuit 22 at a timing at which the output of the AND gate 31 changes into high from low. In the case where each latch circuit 22 outputs eight bits, eight D-FFs 32 are provided and each D-FF 32 holds a bit signal corresponding to data latched by the latch circuit 22.

A feature of the circuit of FIGS. 2 and 3 is that the AND gate 31 and the D-FFs 32 are provided in each holding part 26 and the latch circuit 22 provided corresponding to each hold circuit 24 is shared by the holding parts 26 in the corresponding hold circuit 24. Accordingly, it is not required to provide a latch circuit 22 in each holding part 26, so that the circuit configuration of the holding part 26 is simplified. Since one or more holding parts 26 are provided in each hold circuit 24, the more the number of holding parts 26 provided in each hold circuit 24 increases, the more the entire circuit area of the set feature processing part 20 becomes smaller.

Although FIG. 3 shows an example of using the D-FFs 32, another type of flip flop (for example, a 3K flip flop) may be used. Moreover, the AND gate 31 may be configured with another type of logical operation circuit as far as the logic is the same.

Figure 4:
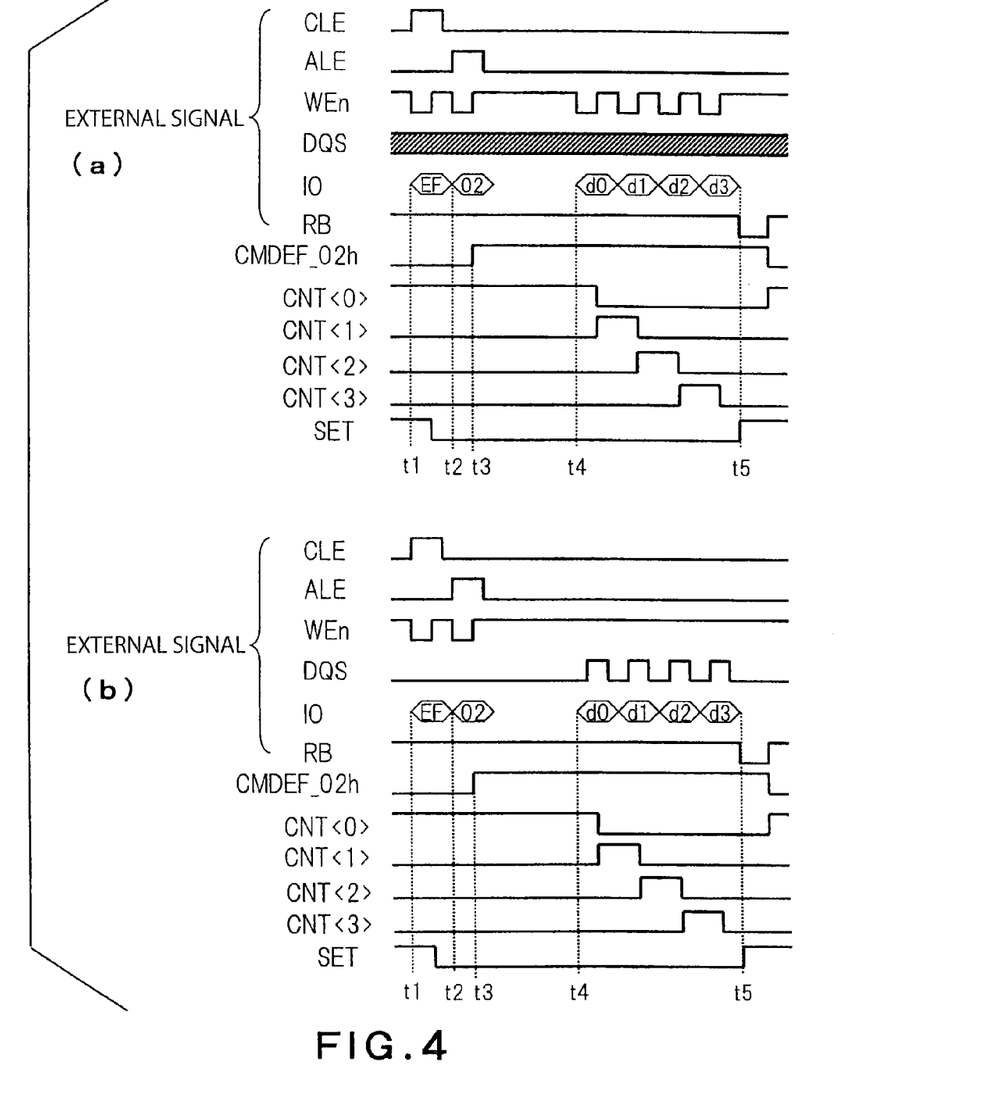
FIG. 4(a) is a timing chart of the semiconductor memory device in a normal operation according to the first embodiment and FIG. 4(b) is a timing chart in a toggle mode.

FIG. 4 is a timing chart of the set feature command sequence in the first embodiment. FIG. 4(a) is a timing chart of a NAND flash memory in a normal operation. FIG. 4(b) is a timing chart in a toggle mode.

In a normal operation, data is written in synchronism with a WEn signal, while in a toggle mode, data is written at high speed in synchronism with a data strobe DQS signal.

FIG. 4 shows each of waveforms of a CLE signal, an ALE signal, a DQS signal, the I/O bus 25, and an RB signal (a first signal). These signals are generated by a controller (not shown) provided separated from a NAND flash memory.

Firstly, at time t1, when a set feature command is supplied on the I/O bus 25, the set feature command sequence starts. In this embodiment, the set feature command is denoted by "FF".

The set feature command is supplied on the I/O bus 25 in synchronism with the CLE signal. Therefore, at a falling edge of the CLE signal, the set feature command can be obtained. When detecting that the set feature command has been supplied on the I/O bus 25, the controller 8 instructs the shift register 21 to perform a shift operation to a pulse signal. Accordingly, in this way, the shift register 21 performs a shift operation to a pulse signal in synchronism with a timing at which data is supplied on the I/O bus 25, as described later.

Next, at time t2, an address signal "02" is supplied on the I/O bus 25 and the ALE signal becomes high. Accordingly, the address decoder 23 receives the address signal "02" on the I/O bus 25 to perform a decode process. FIG. 4 shows an example in which a decode signal CMDEF_02h becomes high at time t3.

Thereafter, at time t4, data is supplied on the I/O bus 25 in synchronism with the WEn signal. FIG. 4 shows an example in which four data d0 to d3 are supplied on the I/O bus in order. These four data d0 to d3 are latched by different latch circuits 22. The timing at which each latch circuit 22 latches data is the timing at which each of CNT<0> to CNT<3> output from the shift register 21 changes into low from high.

Thereafter, at time t5, an RB (Ready Busy) signal which indicates that all data have been supplied on the I/O bus 25 becomes low. When the RB signal becomes low, the SET signal becomes high.

When the SET signal becomes high, the output of the AND gate 31 in the hold circuit 24 shown in FIG. 3 becomes high, so that data latched by a latch circuit 22 are held in the D-FFs 32.

Figure 5:
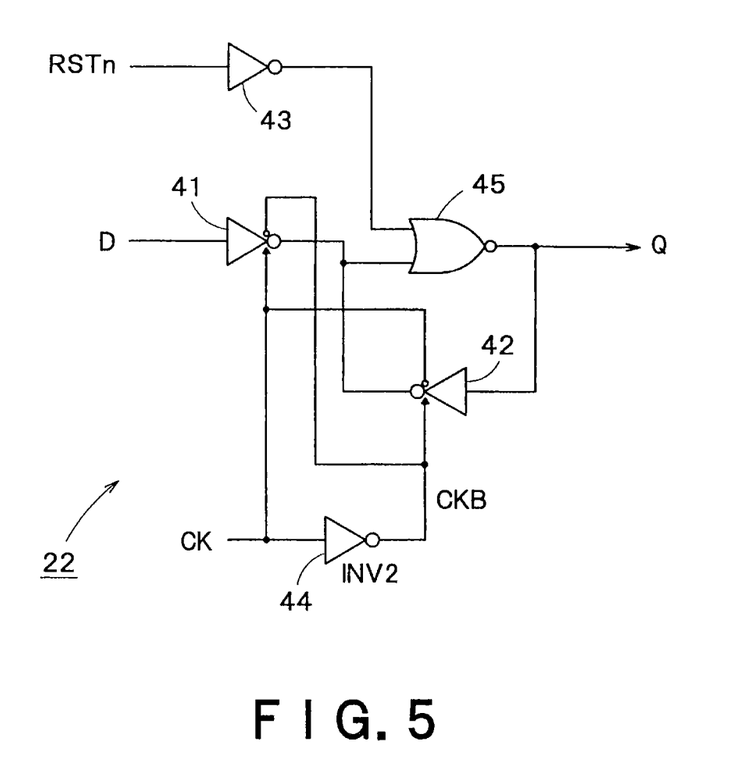
FIG. 5 is a circuit diagram showing an example of each latch circuit 22.

FIG. 5 is a circuit diagram showing an example of the internal configuration of each latch circuit 22. The latch circuit 22 of FIG. 5 is provided with two clocked inverters 41 and 42, two inverters 43 and 44, and a NOR circuit 45. The circuit of FIG. 5 is just an example and various modifications are possible.

Figure 6:
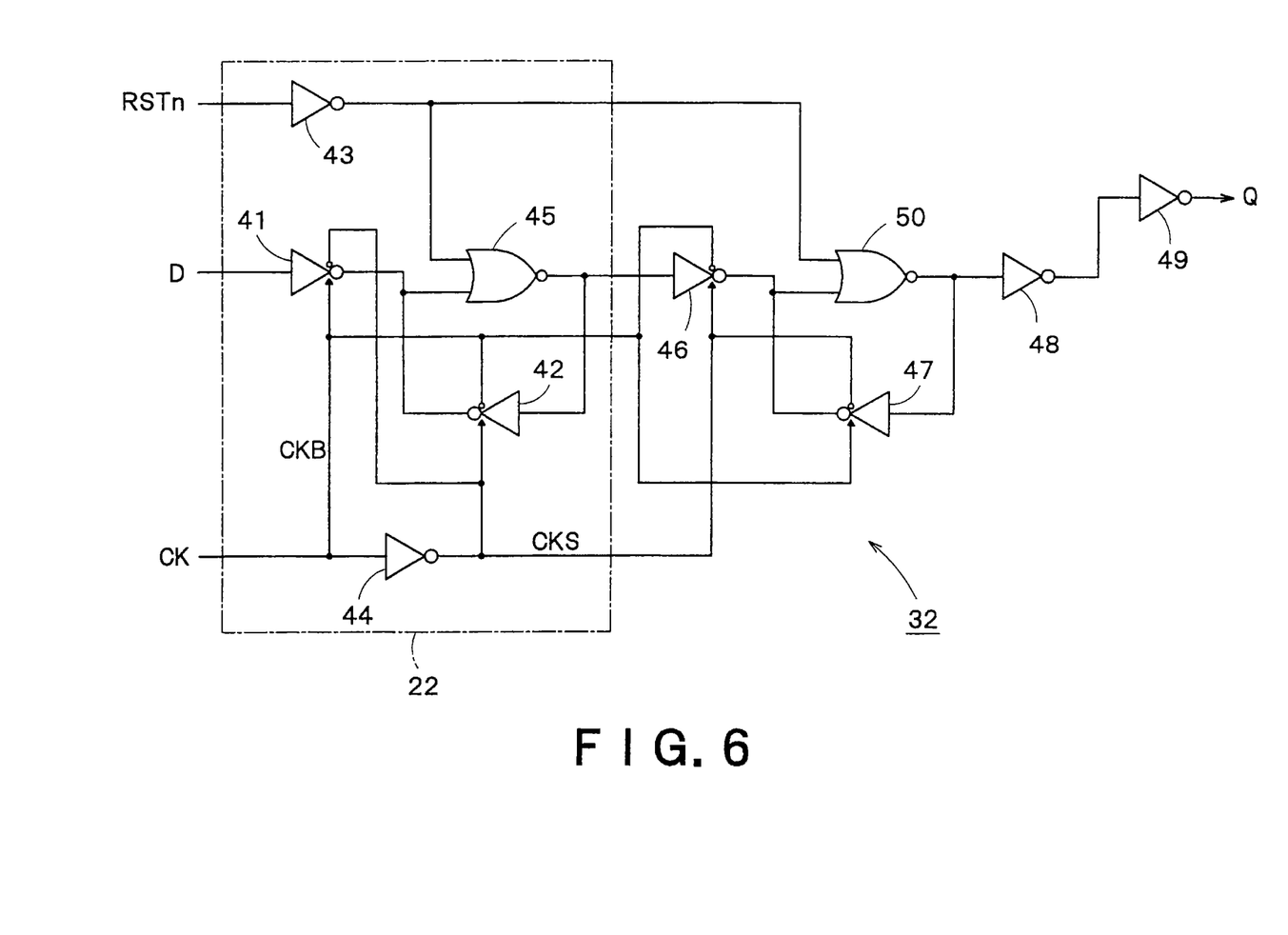
FIG. 6 is a circuit diagram showing an example of each D-FF 32 in each holding part 26.

FIG. 6 is a circuit diagram showing an example of the internal configuration of each D-FF 32 in each holding part 26. The portion surrounded by a broken-line frame in the D-FF 32 of FIG. 6 has the same circuit configuration as the latch circuit 22 of FIG. 5. In addition to this circuit configuration, the D-FF 32 is provided with two clocked inverters 46 and 47, two inverters 48 and 49, and a NOR circuit 50. Accordingly, the D-FF 32 of FIG. 6 has a circuit area about two times as large as the latch circuit 22 of FIG. 5.

Figure 7:
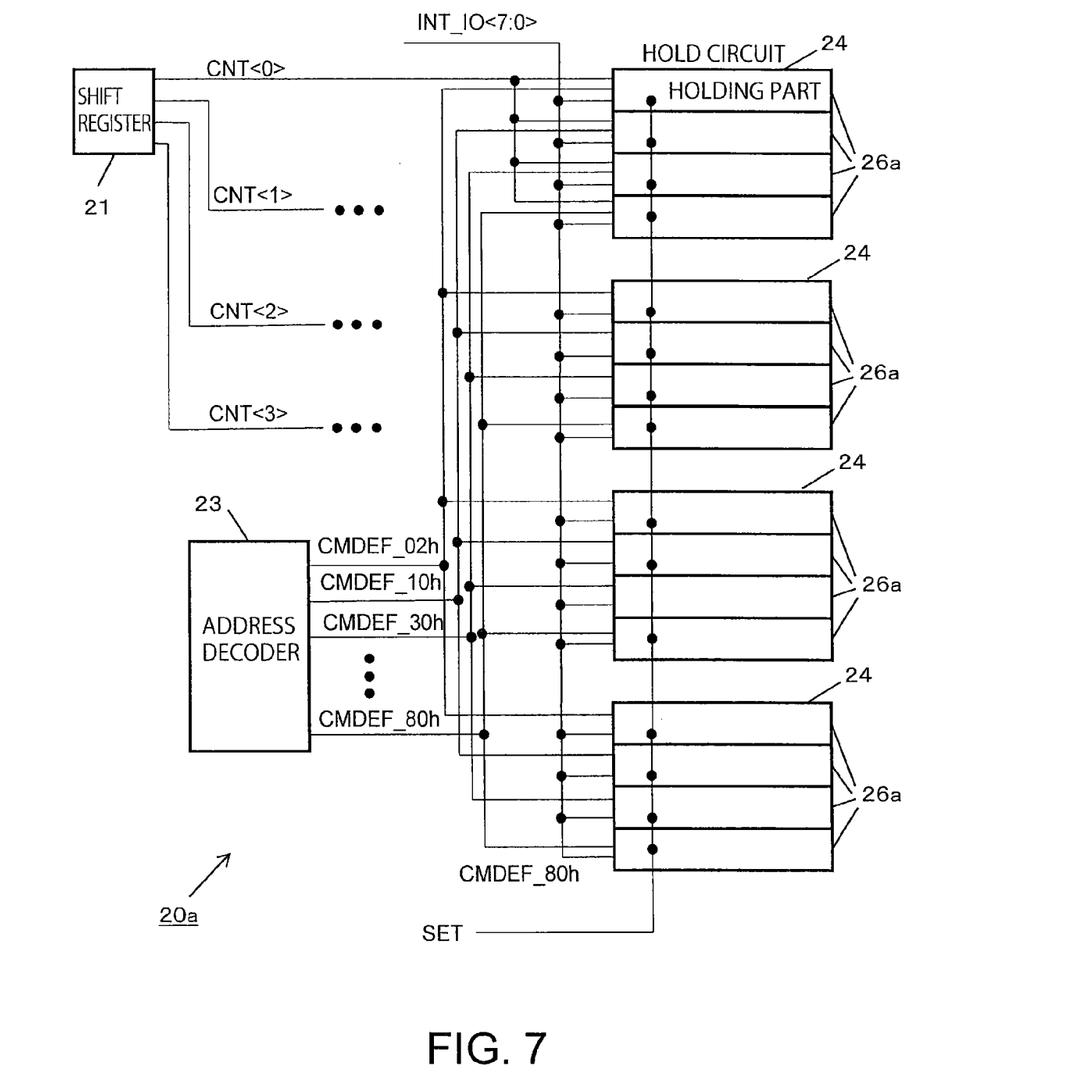
FIG. 7 is a bock diagram of a set feature processing part 20a according to a comparative example.
Figure 8:
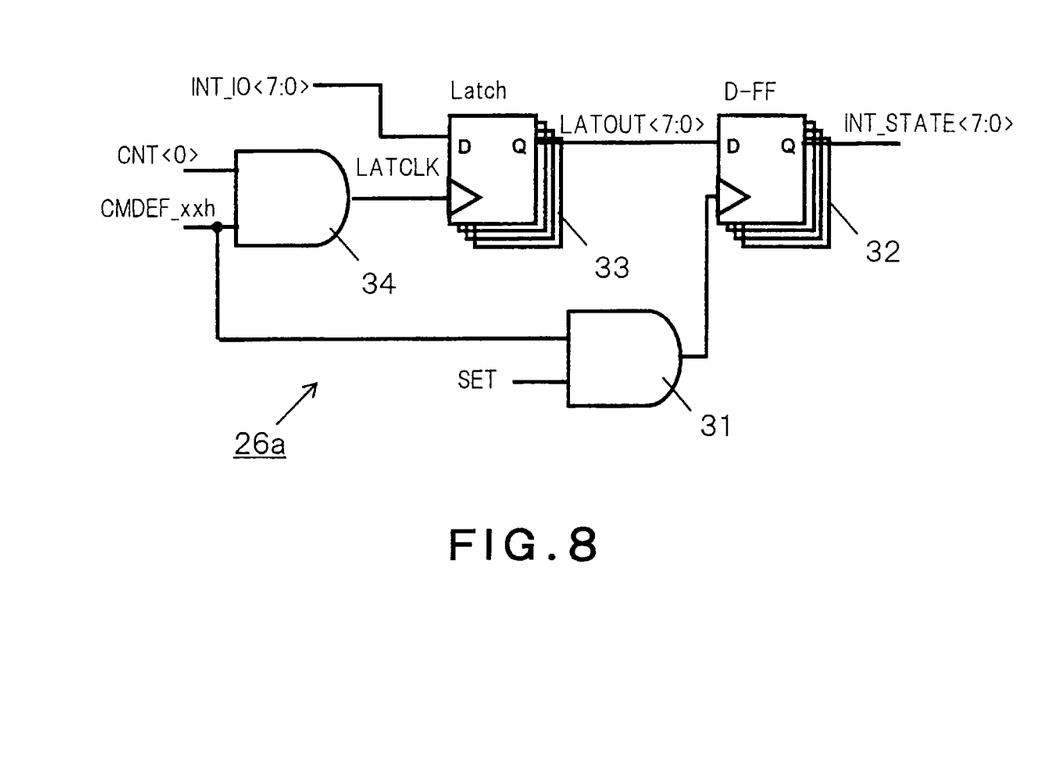
FIG. 8 is a detailed bock diagram of each holding part 26a of FIG. 7.

FIG. 7 is a bock diagram showing the internal configuration of a set feature processing part 20a according to a comparative example. FIG. 8 is a bock diagram showing the detailed configuration of each holding part 26a of FIG. 7.

The set feature processing part 20a of FIG. 7 has the same configuration as the set feature processing part 20 of FIG. 2, except that the four latch circuits 22 are omitted. Each holding part 26a in each hold circuit 24 of FIG. 7 has, with reference to the detailed configuration shown in FIG. 8, a latch circuit 33 (Data Latch) and an AND gate 34, in addition to an AND gate 31 and D-FFs 32, in the same manner as FIG. 3.

The AND gate 34 generates a logical product signal of an output signal of the shift register 21 and a decode signal generated by the address decoder 23. The latch circuit 33 latches data on the I/O bus 25 at a timing at which the logical product signal changes into high from low.

The AND gate 31 generates, like the AND gate 31 of FIG. 3, a logical product signal of a decode signal generated by the address decoder 23 and a SET signal. Each D-FF 32 holds a latch signal of the latch circuit 22 at a rising edge of the logical product signal.

As described above, in the set feature processing part 20a according to a comparative example shown in FIG. 7, its internal holding parts 26a have a more complex internal configuration than the holding parts 26 of FIG. 3. In more detail, each holding part 26a additionally requires the latch circuit 33 and the AND gate 34. Since one or more holding parts 26 are provided in each hold circuit 24, as the number of holding parts 26 is larger, the entire circuit area of the set feature processing part 20a of FIG. 7 becomes larger than the set feature processing part 20 of FIG. 2.

The set feature processing part 20 of FIG. 2 can be more simplified than that of the comparative example concerning the internal configuration of the holding parts 26 in the hold circuits 24. This is because, in FIG. 2, the latch circuit 22 that corresponds to the latch circuit 33 provided in the holding part 26a in FIG. 8, is provided outside each hold circuit 24 and is shared by holding parts 26 in each hold circuit 24.

As described above, according to the first embodiment, the internal configuration of the set feature processing part 20 that executes the set feature command sequence can be simplified. In more detail, the internal configuration of each holding part 26 in each hold circuit 24 that holds data on the I/O bus 25 is simplified so that each holding part 26 is provided with the AND gate 31 and the D-FFs 32, and the latch circuit 22 provided outside each hold circuit 24 is shared by the holding parts 26 in each hold circuit 24. Therefore, the entire circuit area of the set feature processing part 20 can be made smaller.

(Second Embodiment)

A second embodiment which will be explained below is to reduce the circuit area of the set feature processing part 20 much more than the first embodiment.

Figure 9:
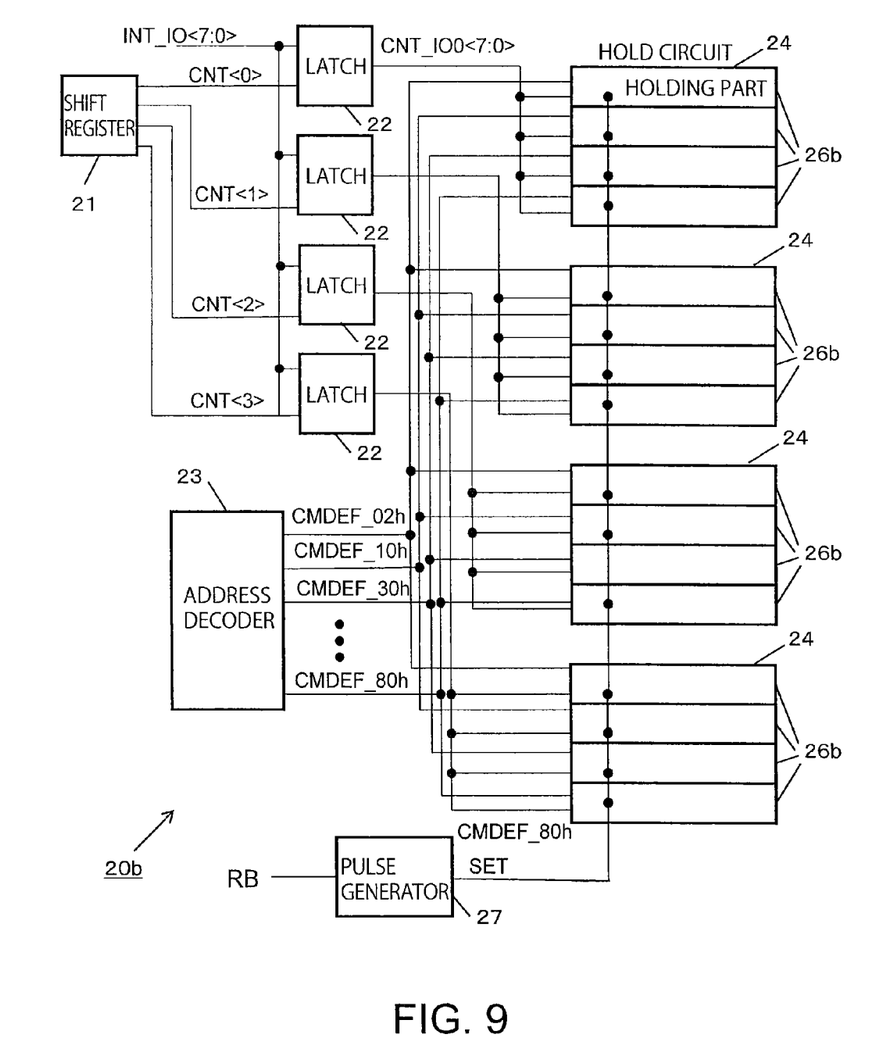
FIG. 9 is a block diagram of a set feature processing part 20b according to a second embodiment.

FIG. 9 is a block diagram of a set feature processing part 20b according to the second embodiment. Compared with FIG. 2, the set feature processing part 20b of FIG. 9 is added with an pulse generator 27. In addition to this, the set feature processing part 20b of FIG. 9 is different from FIG. 2 concerning the internal configuration of the holding parts 26b in each hold circuit 24.

Figure 10:
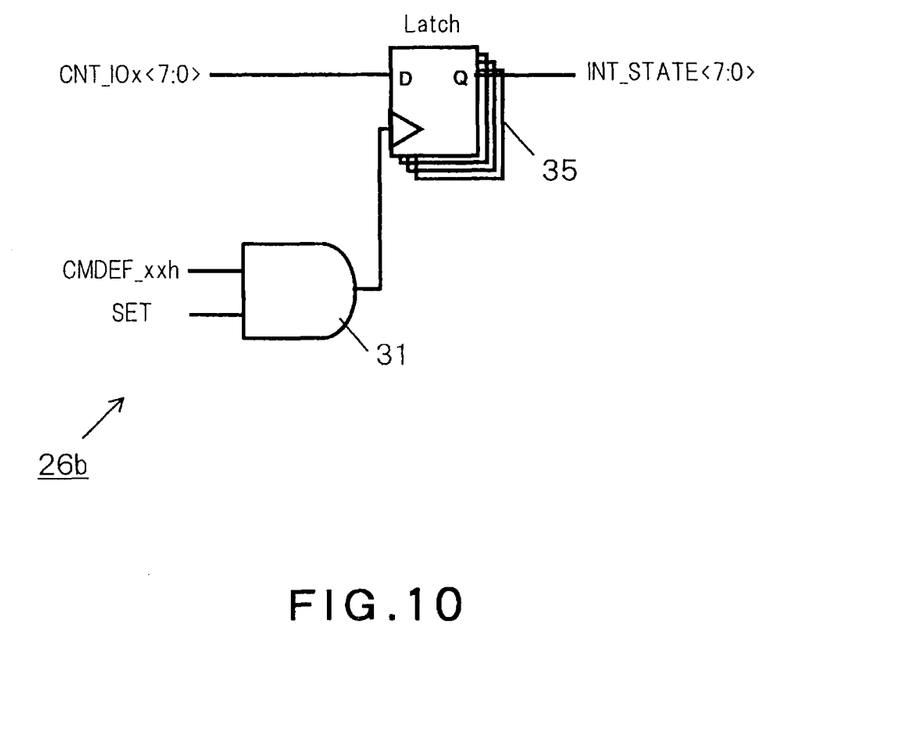
FIG. 10 is a block diagram of the internal configuration of each holding part 26b in each hold circuit 24 of FIG. 9.

FIG. 10 is a block diagram showing the internal configuration of each holding part 26b in each hold circuit 24 of FIG. 9. The holding part 26b of FIG. 10 has an AND gate (a second logical operation unit) 32 and a latch circuit (a second latch circuit, or Configuration Latch) 35. As shown, the holding part 26b of FIG. 10 has the latch circuit 35 instead of the D-FFs 32 of FIG. 3.

The AND gate 31 of FIG. 10, like FIG. 3, generates a logical product signal of a decode signal generated by the address decoder 23 and a SET signal. The latch circuit 35 latches data latched by the corresponding latch circuit 22 at a timing of transition of the logical product signal from high to low.

The SET signal of FIG. 10 is generated by the pulse generator 27, as shown in FIG. 9. The pulse generator 27 generates a SET signal of a one-shot pulse when an RB signal changes into low from high.

Figure 11:
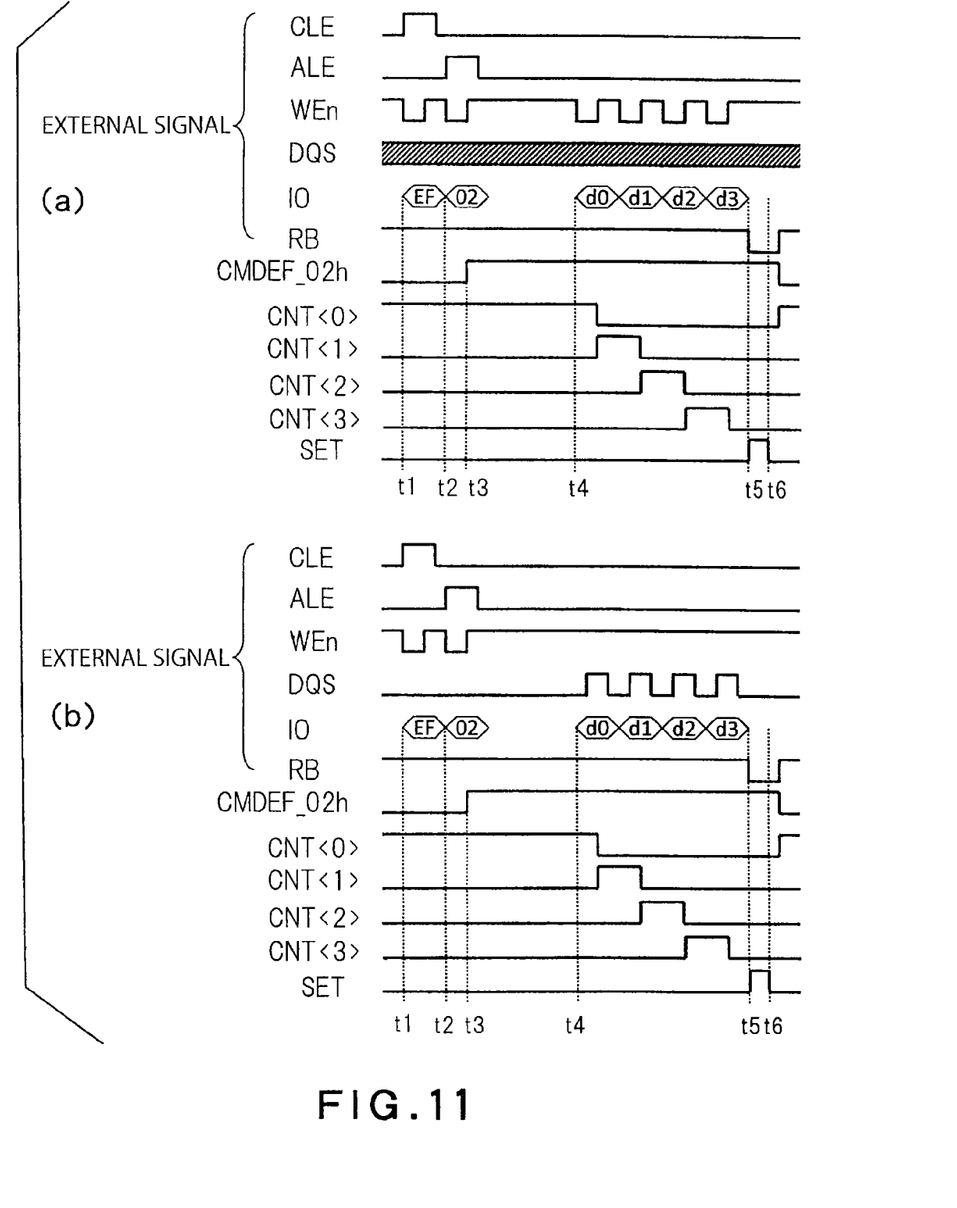
FIG. 11(a) is a timing chart of a semiconductor memory device in a normal operation according to the second embodiment and FIG. 11(b) is a timing chart in a toggle mode.

FIG. 11 is a timing chart of a set feature command sequence in the second embodiment. FIG. 11(a) is a timing chart of a NAND flash memory in a normal operation. FIG. 11(b) is a timing chart in a toggle mode.

In the timing chart of FIG. 11, the SET signal has a different waveform, when compared with the timing chart of FIG. 4. As described above, a pulse of the SET signal is generated by the pulse generator 27 when the RB signal changes into low. Then, at time t6 at which the pulse changes into low from high, the latch circuit 35 in each hold circuit 24 latches data of the corresponding latch circuit 22.

The reason for providing the pulse generator 27 in the set feature processing part 20b of FIG. 9 is as follows. The latch circuit 35 cannot hold data at a rising edge of the SET signal as shown in FIG. 4. This is because the pulse generator 27 generates a new SET signal of a one-shot pulse and then the latch circuit 35 latches data at a timing at which this SET signal changes into low from high. By providing such a SET signal, the latch circuit 35 can be used instead of the D-FFs 32.

The latch circuit 35 in the holding part 26b of FIG. 10 is provided with the same circuit as FIG. 5. Therefore, the circuit area of the hold circuit 24 of FIG. 10 can be reduced more than the hold circuit 24 of FIG. 3 using the D-FFs 32. The set feature processing part 20b of FIG. 9 is added with the pulse generator 27 compared with the set feature processing part 20 of FIG. 2. However, since the holding parts 26b of each hold circuit 24 have a reduced circuit area, the entre circuit area of the set feature processing part 20 can be reduced more than that in FIG. 2.

Figure 12:
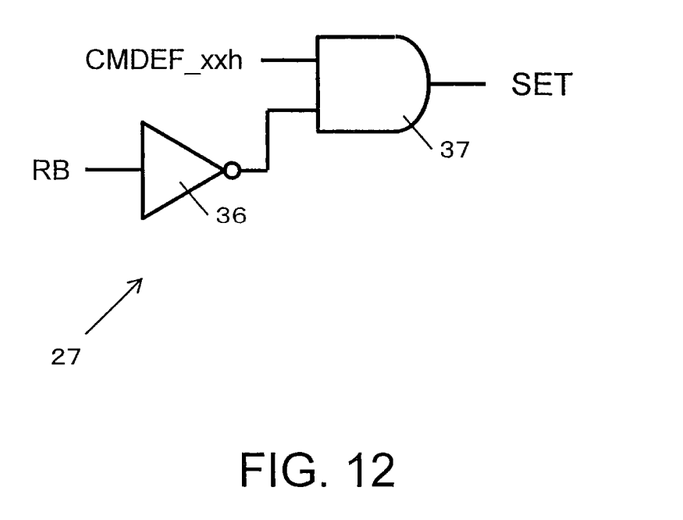
FIG. 12 is circuit diagram showing a modification of a pulse generator.

The pulse generator 27 is not always necessarily configured with a circuit that generates a one-shot pulse signal at a timing at which the RB signal changes into low from high. For example, as shown in FIG. 12, a pulse signal may be generated by a logical operation of the RB signal and another signal (for example, a CMDEF_xxh signal). The pulse generator 27 of FIG. 12 is provided with an inverter 36 that inverts an RB signal and an AND gate 37 that generates a pulse signal SET by logical product of an output signal of the inverter 36 and a CMDEF_xxh signal. As described, there is no particular limitation on the actual circuit configuration of the pulse generator 27.

As described above, in the second embodiment, the latch circuit 35 is provided in each holding part 26b instead of the D-FFs 32 and the pulse generator 27 is provided for generating a timing signal that is latched by the latch circuit 35. Therefore, the entire circuit area of the set feature processing part 20b becomes much smaller than the first embodiment.

In the first and second embodiments described above, examples in which the set feature processing parts 20 and 20b according to the embodiments are installed in a NAND flash memory, have been explained. However, the set feature processing parts 20 and 20b according to the embodiments are applicable to various types of semiconductor memory devices with memory internal states externally changeable.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a plurality of first latch circuits latching setting-data at different timings;
   a plurality of hold circuits, provided corresponding to the respective plurality of first latch circuits, each holding data latched by the corresponding first latch circuit; and
   an address decoder decoding an address that specifies a destination to hold the data,
   wherein each of the plurality of hold circuits has one or more holding parts that hold data latched by the corresponding first latch circuit based on a decode signal decoded by the address decoder.

2. The device of claim 1, wherein, after the plurality of first latch circuits have performed a latching operation, the plurality of hold circuits hold the corresponding data at a same timing.

3. The device of claim 2, wherein each of the plurality of hold circuits holds the corresponding data in synchronism with a first signal that becomes a specific logic state after the plurality of first latch circuits have performed the latching operation.

4. The device of claim 1, wherein each of the holding parts comprises:
   a first logical operation unit configured to perform a logical operation to the decode signal and a first signal that becomes a specific logic state after all of the plurality of first latch circuits have performed a latching operation, thereby generating a second signal; and
   a plurality of flip-flops holding data latched by the corresponding latch circuit, in synchronism with the second signal.

5. The device of claim 1 comprising a pulse generator generating a pulse signal when a first signal becomes a specific logic state after the plurality of first latch circuits have performed a latching operation,
   wherein each holding part comprises:
   a second logical operation unit configured to perform a logical operation using the decode signal and the pulse signal to generate a third signal; and
   a second latch circuit latching data latched by the corresponding latch circuit, at a timing at which the third signal changes from a first logic state to a second logic state.

6. The device of claim 1, wherein, when a command coming from outside the semiconductor memory device is detected, the plurality of first latch circuits latch a plurality of data coming from outside in succession, and
   the plurality of hold circuits hold the latched data after the plurality of first latch circuits have latched data coming from outside and corresponding to the command.

7. The device of claim 6, wherein the command is a set feature command for setting an internal state of a NAND flash memory from outside thereof.

* * * * *